United States Patent [19]

Engle

[11] Patent Number: 5,247,222
[45] Date of Patent: Sep. 21, 1993

[54] CONSTRAINED SHEAR MODE MODULATOR

[76] Inventor: Craig D. Engle, 336 N. Cline Ave., Griffith, Ind. 46319

[21] Appl. No.: 787,673

[22] Filed: Nov. 4, 1991

[51] Int. Cl.$^5$ ............................................. H01L 41/08
[52] U.S. Cl. ..................................... 310/328; 310/366
[58] Field of Search ............... 310/328, 333, 359, 366, 310/368

[56] References Cited

U.S. PATENT DOCUMENTS

| | | | |
|---|---|---|---|
| 3,463,572 | 8/1969 | Preston, Jr. | 350/161 |
| 3,479,109 | 11/1969 | Preston, Jr. | 350/161 |
| 3,480,348 | 11/1969 | Preston, Jr. | 350/161 |
| 3,487,239 | 12/1969 | Schafft | 310/8.5 |
| 3,544,202 | 12/1970 | Fowler | 350/285 |
| 3,558,351 | 1/1971 | Foster | 117/201 |
| 3,904,274 | 9/1975 | Feinleib et al. | 350/161 |
| 4,600,854 | 7/1986 | Bednorz et al. | 310/328 |
| 4,736,132 | 4/1988 | Culp | 310/333 |
| 4,812,698 | 3/1989 | Chida et al. | 310/328 |
| 4,879,568 | 11/1989 | Bartky et al. | 310/333 |
| 4,887,100 | 12/1989 | Michaelis et al. | 310/333 |
| 4,944,580 | 7/1990 | MacDonald et al. | 310/328 |
| 5,016,028 | 5/1991 | Temple | 310/333 |

FOREIGN PATENT DOCUMENTS 3150696 6/1983 Fed. Rep. of Germany ...... 310/328

OTHER PUBLICATIONS

T. R. Gururaja, et al. "Continuous Poling of PZT Fibers and Ribbons and its Application to New Devices." Ferroelectrics, 1983, vol. 47, pp. 193–200.
Ko, et al., "Bonding Techniques for Microsensors", Micromaching and Micropackaging of Transducers, edited by C. D. Fung, et al., Elsevier Science Publishers, B. V. Amsterdam, 1985.
Don L. Kendall, et al. "Orientations of the Third Kind: The Coming of Age of (110) Silicon." Micromachining and Micropackaging of Transducers, edited by C. D. Fung, et al., Elsevier Science Publishers, B. V. Amsterdam, 1985.
R. T. Howe. "Polycrystalline Silicon Microstructures." Micromachining and Micropackaging of Transducers, edited by C. D. Fung, et al., Elsevier Science Publishers, B. V. Amsterdam, 1985.
Kazuaki Utsumi, et al., "Application of Designed-Space Forming Technology", Japanese Journal of Applied Physics, vol. 26 (1987), Supplement 26-2, pp. 54–56.
"Excimer-Laser-Induced Etching of Ceramic PbTi$_{1-x}$Zr$_x$O$_3$" by M. Eyett and D. Baverle. J. Applied Phys. 62(4), Aug. 15, 1987.

(List continued on next page.)

Primary Examiner—Mark O. Budd
Assistant Examiner—Thomas M. Dougherty

[57] ABSTRACT

A new mounting configuration for piezoelectric shear mode elements is described. The element is mounted in a cantilever beam fashion. The polarization axis forms an acute angle with the mounting surface normal. A reflective electrode is affixed to a first surface of the element. The first surface normal is perpendicular to the polarization axis. A second electrode is affixed to a second surface which is parallel to the first surface. A voltage is applied across the reflective electrode and the second electrode to generate strain in the element. This results in a deflection of the reflective electrode, phase modulating electromagnetic and/or acoustic wavefronts incident on the reflective electrode. Stress distribution and hence phase modulation properties may be influenced using this mounting technique. Elements may be coupled end to end to form new devices. Antiparallel polarization coupled elements exhibit large rates of change of deflection. These elements may be formulated by a ferroelectric inversion layer. A support structure design and a reflective electrode overhang concept are introduced. Arrays using these concepts with the mounting technique described are able to reduce electrical interference without compromising spatial resolution.

34 Claims, 3 Drawing Sheets

CONSTRAINED SHEAR MODE MODULATOR

BACKGROUND

1. Field of Invention

This invention relates to phase modulation of electromagnetic and/or acoustical wavefronts using surface deformation type phase modulators.

2. Description of Prior Art

Prior art concerning surface deformation type phase modulators will be broadly classified into two categories. Those devices using monolithic phase modulating media, and those devices using discrete elements. Examples of monolithic phase modulating include oil films, elastomer layers, piezoelectric media, glass substrates, and thin membranes. Devices employing monolithic media exhibit deformations which are non-localized. This is undesirable since it imposes a limit on spatial resolution.

Discrete element modulators offer a device philosphy amenable to isolation, thereby permitting high spatial resolution. Previous discrete element modulators utilizing piezoelectric shear mode elements include U.S. Pat. No. 3,544,202 to Fowler, Dec. 1, 1970 and U.S. Pat. No. 4,736,132 to Culp, Apr. 5, 1988. In both of these configurations, one electrode functions as a motion constraint by affixing it to a rigid support structure. Separate surfaces are dedicated to the phase modulation and electrode functions. This mounting technique is limited in how it may influence the stress distribution in the piezoelectric element.

In discrete, closely packed arrays, adjacent elements must be electrically isolated. In U.S. Pat. No. 4,736,132, to achieve electrical isolation, a restriction must be placed on the potential that can be applied to adjacent electrodes or at least one additional electrical insulator must be added between adjacent electrodes. Using the latter approach adds fabrication steps and reduces spatial resolution of the array. This is contrary to the philosophy of discrete element arrays. Restricting the potentials applied to adjacent electrodes under utilizes device capability. Furthermore, the support structure of U.S. Pat. No. 4,736,132 provides no assistance in isolating adjacent electrodes.

Shear mode actuators have been utilized in other applications unrelated to phase modulation of electromagnetic wavefronts. Examples include U.S. Pat. No. 4,879,568 to Bartky et al, Nov. 7, 1989.

The shear mode actuators of U.S. Pat. No. 4,879,568 must provide a sealed channel for use as an ink jet droplet generator. As identified in FIGS. 2(a) and 3(a), a compliant strip seal 54 and a continuous compliant strip seal 541 are essential components for this application. As to be identified herein, no such components are required in wavefront phase modulator configurations. Consequently, U.S. Pat. No. 4,879,568 would contain extraneous components if this configuration were contemplated for a new use application involving wavefront phase modulation. Such extraneous components hinder wavefront phase modulator performance. Dual end constraints, necessary for a sealed channel, exist in some form in the remaining embodiments of U.S. Pat. No. 4,879,568.

In addition, no provisions are provided for an optically reflective surface to phase modulate an incident wavefront. As well understood by those knowledgeable in the state of the art, optically reflective surfaces could be metal, but not all metal surfaces are optically reflective surfaces, i.e. gold strongly absorbs in certain "optical" portions of the electromagnetic spectrum. Specifying metal electrodes is not a sufficient condition for producing optically reflective surfaces. Such a specification could severely restrict the spectral flexibility of deformable mirror spatial light modulators. Not specifying an optically reflective surface renders this device dubious for wavefront phase modulator applications.

Furthermore, as well understood by those knowledgeable in the state of the art, no optically reflective surface provisions are identified for the surface most effective for phase modulation in the embodiment illustrated in FIGS. 6(a) or 6(b). Not identifying an optically reflective surface for use in this application renders this embodiment unsuitable for use in wavefront phase modulators. Not maintaining a consistent, suitable set of requirements, suggests that U.S. Pat. No. 4,879,568 was not contemplated for use as an electromagnetic wavefront modulator.

No suitable one or two dimensional wavefront modulator array configurations are available in U.S. Pat. No. 4,879,568. Linear arrays of shear mode actuators are identified in FIG. 9(a). Adjacent shear mode actuators are displaced perpendicular to the surface, when the elements are unenergized, which would be most effective in phase modulation applications. This superimposes all metal electrodes. If a wavefront to be modulated were incident on a metal electrode of an exposed shear mode element, then, due to the nature in which the remaining elements are arranged in FIG. 9(a), the exposed element would eclipse the remaining elements, rendering them useless in phase modulation applications. Two dimensional arrays formed from a plurality of such one dimensional arrays would not be capable of phase modulation in two spatial degrees of freedom. No suitable spatial distribution of shear mode actuators has been identified in U.S. Pat. No. 4,879,568 which could allow shear mode elements to effectively, efficiently, and consistently function as linear or two dimensional wavefront phase modulators involving electromagnetic and/or acoustic wavefronts.

Since U.S. Pat. No. 4,879,568 is plagued by extraneous components, no acceptable and/or an inconsistent definition of optically reflective surfaces and an unsatisfactory spatial distribution of shear mode elements for use in linear and/or two dimensional phase modulators, U.S. Pat. No. 4,879,568 is deemed unacceptable for new use applications involving phase modulation of electromagnetic and/or acoustic wavefronts.

The pitfalls of U.S. Pat. No. 4,879,568 are shared by other ink jet droplet generators.

OBJECTS AND ADVANTAGES

Accordingly, several objects and advantages of my invention are:

(a) to introduce a new mounting technique for piezoelectric shear mode elements.
 (b) to introduce a variable of the mounting technique that can be utilized to influence stress distribution in the shear mode element.
 (c) to utilize geometry available in the mounting technique to couple piezoelectric shear mode elements.
 (d) to show how the electrode geometry associated with this mounting technique can reduce signal interference between elements of an array.
 (e) to increase functionality of the support structure by having it also serve as an electrical insulating element without reducing spatial resolution of the array.

(f) to increase the functionality of the electrodes by having them also serve as phase modulating elements.

(g) to improve controllability of the phase modulating elements with a minimum number of components and no operational restrictions so as to enhance commercial viability of the phase modulator.

Further objects and advantages of my invention will become apparent from consideration of the drawings and ensuing description of it.

DRAWING FIGURES

In the drawings, closely related figures have the same numbers but different alphabetic suffixes.

REFERENCE NUMERALS IN DRAWING

10—constrained piezoelectric shear mode modulating element
12—electrically insulating support structure
14—ridges
16—buss bar
18—piezoelectric block
20—piezoelectric polarization direction of block 18
22—left end surface of block 18
24—flexible reflective electrode
26—top surface of block 18
28—flexible conductor
30—second electrode
32—bottom surface of block 18
34—external contact electrode
36—perforation
38—right end surface of block 18
40—wells
42—side wall of well 40
44—overhang
46—insulating rigid spacer

DESCRIPTION FIGS. 1-9

Figure 1:
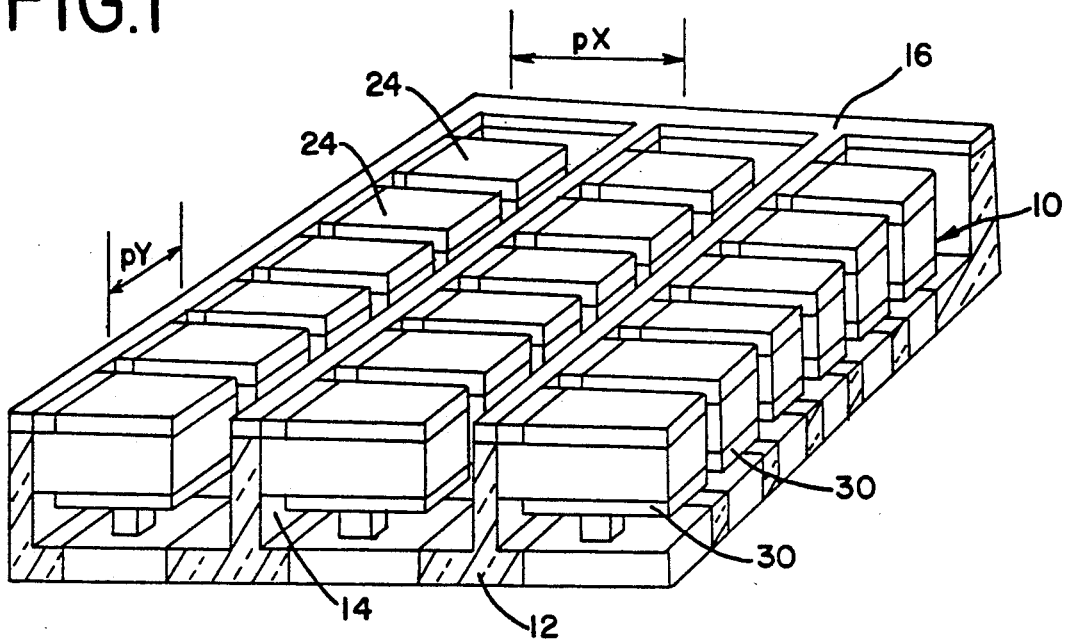
FIG. 1 is a perspective view of a two dimensional array containing a plurality of constrained shear mode modulating elements. All elements are in an unenergized state.

FIG. 1 is a perspective view of an array containing a plurality of constrained piezoelectric shear mode modulating elements, generally designated as 10. An electrically insulating support structure 12 contains ridges 14. Each and every element 10 of the array is affixed to a ridge 14. A buss bar 16 is affixed to the top of ridge 14 to provide a common electrical potential to all elements 10. Arrows PY and PX indicated the spatial period of the two dimensional array.

Ridges 14 may be fabricated in a number of ways. Ridges 14 could be deposited or grown on structure 12. Structure 12 could be selectively etched to generate the surface profile. Applications for the device are many, and should influence fabrication methods and material selection. For instance, when employing an electrical addressing scheme using an electron beam, thermal isolation of element 10 from structure 12 may be important. Spatial resolution requirements further influence approaches. Structure 12 could be a photosensitive glass which can be chemically etched. Such a glass could be FOTOCERAM. FOTOCERAM is a trade name of Corning Inc., Corning N.Y. Metal Working tools and techniques could be used on machinable glass cermaic. Such a machinable glass ceramic could be MACOR. MACOR is a trade name of Corning Inc., Corning N.Y. MACOR is comprised of a fluorophlogopite mica phase (55%) interspersed in a borosilicate glass matrix (45%). The low thermal conductivity of MACOR makes it ideal for use in thermal isolation of element 10.

A designed-space forming process using ceramic green sheets can be used to make fine spaces accurately in ceramics. Such a process is described in the article "Applications of Designed-Space Forming Technology." by Kazuaki Utsumi et al, Proceeding of the 6th meeting on Ferroelectric Material and Their Application, Kyoto 1987, Japanese Journal of Applied Physics, Vol. 26 (1987) Supplement 26-2, pp 53-56. Excimer-laser induced etching may be used to assist in fabricating the device. Visible $Ar^+$ and $Kr^+$ laser radiation may be employed in $H_2$ atmospheres for etching grooves and holes. References include "Excimer-laser-induced etching of ceramic $PbTi_{1-x}Zr_xO_3$." by M. Eyett et al, J. Applied Phys. Vol. 62, No. 4, Aug. 15, 1987, 1511–1514, and "Laser-Induced Chemical Etching of Ceramic $PbTi_{1-x}Zr_xO_3$." by Eyett et al, Appl. Phys. A40, 235–239 (1986).

Microstructures in Silicon may be fabricated with an anisotropic chemical etching of the three major orientations of Silicon in $KOH/H_2O$. Polycrystalline Silicon microstructures can be fabricated on Silicon substrates by etching an underlying oxide layer. Electrostatic bonding of glass or other ceramic materials to metal, Silicon or Gallium Arsenide can fulfill many of the requirements for bonding and mounting micromechanical structures. References include "Polycrystalline Silicon Microstructures," R. T. Howe Micromachining and Micropackaging of Transducers edited by C. D. Fung, P. W. Chung, W. H. Ko, and D. G. Fleming, "Orientation of the Third Kind: The Coming of Age of (110) Silicon" by Don L. Kendall and G. R. deGuel, Micromachining and Micropackaging of Transducers, "Bonding Techniques for Microsensors" by W. H. Ko, J. T. Suminto, and G. J. Yeh, Micromachining and Micropackaging of Transducers.

Figure 2:
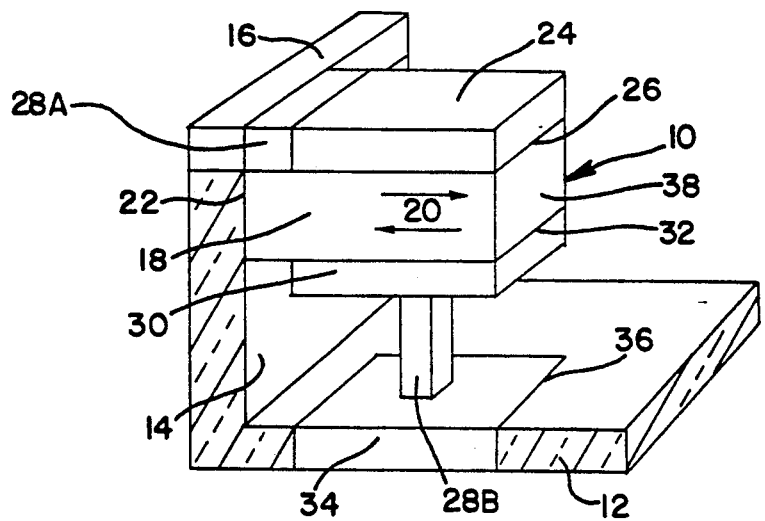
FIG. 2 is a perspective view of a single constrained shear mode modulating element in an unenergized state.

FIG. 2 is a perspective view of a single element 10 in an unenergized state. Element 10 contains a piezoelectric block 18.

Block 18 is piezoelectrically polarized in one of the two directions indicated by arrows 20. A left end surface 22 of block 18, intercepts polarization direction 20 of block 18. Surface 22 is affixed to ridge 14. A flexible reflective electrode 24 is affixed to a top surface 26 of block 18. A flexible conductor 28A connects buss bar 16 to electrode 24. Alternativily electrode 24 may be extended to make the connection to buss bar 16. A second electrode 30 is affixed to a bottom surface 32 of block 18. Surface normals to surface 26 and 32 are perpendicular to polarization direction 20. Surfaces 26 and 32 are parallel planes. An external contact electrode 34 is embedded in a perforation 36 of structure 12. Flexible conductor 28B connects electrode 34 to electrode 30. Right end surface 38 has no motion constraint.

Perforation 36 could be generated by $CO_2$ laser drilling of glass, or any of the previously mentioned techniques. Additional reference includes "Electrical Contacts to Implated Integrated Sensors by $CO_2$ Laser Drilled Vias Through Glass" by Lyn Bownan, Joseph M. Schmitt, and James D. Meindl, Micromachining and Micropackaging of Transducer.

Materials used by block 18 could be Lead Zirconate Titanate, Zinc Oxide, Barium Titanate, Lead Titanate, Polyvinylidene Flouride, Lithium Niobate. If material selection for block 18 requires poling, polarization direction 20 may be achieved by several techniques. Grooves may be etched in ridges 14. A conductive material can be deposited in the grooves. These may now serve as poling electrodes. Upon completion of poling operations, these electrodes are removed and the grooves filled. Alternatively, a device similar to that described in the article "Continuous Poling of PZT Fibers and Ribbons and its Application to New Devices.", by T. R. Gururaja et al, Ferroelectrics, 1983, Vol 47, pp 193-200 may be used. The effectiveness of this type of approach depends on the thickness of block 18. Guidelines are provided in the reference.

Techniques for influencing the crystallographic orientation of thin films exists and include U.S. Pat. No. 3,558,351 to Foster, Jan. 26, 1971 and the article "Fabrication and Application of Piezo and Ferroelectric Films" by Abhai Mansingh, Ferroelectrics, 1990, Vol. 102, pp 69-84.

Figure 3:
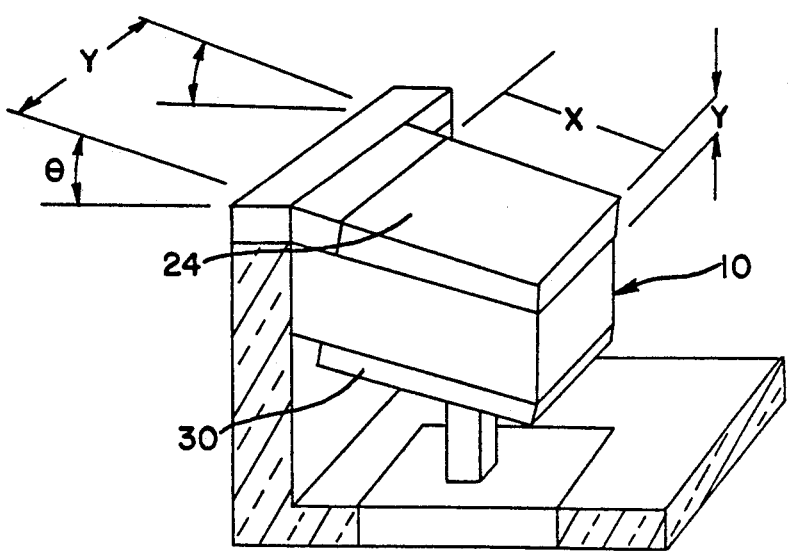
FIG. 3 is a perspective view of a single constrained shear mode modulating element in an energized state.

FIG. 3 shows a single shear mode modulating element 10 in an energized state. A variable $\theta$ is used to characterize the surface profile. As shown, electrode 24 (and electrode 30) possess a thickness t and a surface area associated with dimensions x and y.

Referring to FIG. 1, electrode geometry of my invention aids in electrical isolation of elements 10. As illustrated, adjacent electrodes 24 are held at a common potential. No electrical interference exists, and maintaining a common potential on each and every element 24 does not restrict phase modulation capabilities of element 10.

In the array depicted in FIG. 1, adjacent electrodes 30 have a side area of (t) (x) exposed to its neighbor. In U.S. Pat. No. 4,736,132, FIG. 5, adjacent electrodes have the surface area of its face exposed to its neighbor. This situation exists for both outer electrodes of U.S. Pat. No. 4,736,132. In many applications, electrode thickness t will be less than dimensions x or y. Side area exposure will be less than face area exposure. In my invention, electrical interference is controlled by a geometry which confines interference to one electrode, and then reduces the exposed area to minimize the problem.

Figure 4:
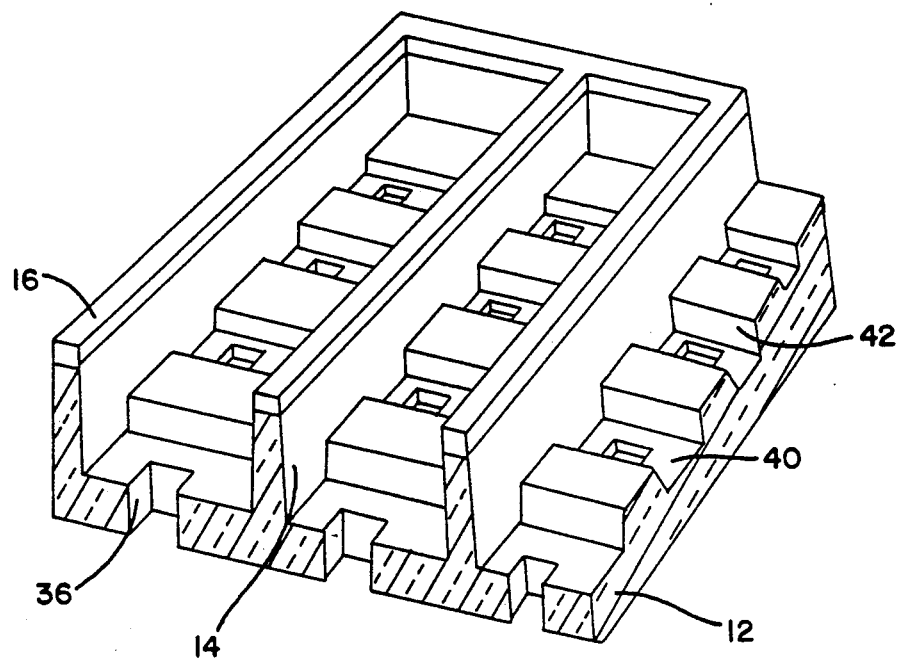
FIG. 4 is a perspective view of a support structure modified to improve electrical isolation in the array.

FIG. 4 shows how structure 12 may be modified to provide additional electrical isolation between adjacent electrodes 30. Wells 40 are formed in structure 12, for each and every element 10. A side wall 42 of well 40 acts as an electrical insulator between adjacent electrodes 30. Perforations 36 are located in the buttom of well 40. Element 10 is affixed to ridge 14 in a manner that recesses electrode 30 in well 40. Dimensions of well 40 are chosen so no mechanical interference exists with element 10 over the angular range of travel of element 10.

Figure 5:
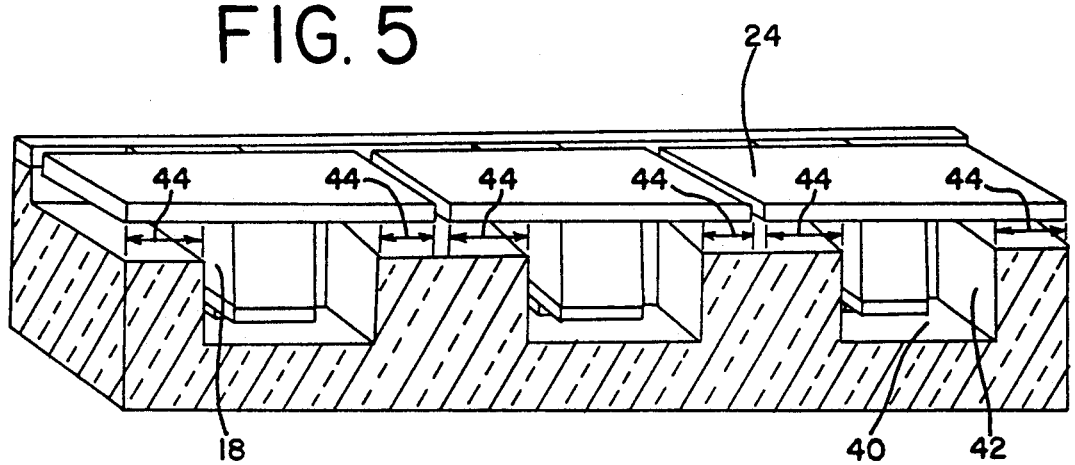
FIG. 5 is a perspective view of an array column whose reflective electrodes have an overhang.

FIG. 5 shows how to effectively utilize the spatial period of an array in the presence of side walls 42. Dimensions of reflective electrode 24 are chosen to meet spatial resolution requirements for an application. Block 18 has reduced dimensions in comparison to electrode 24, creating an overhang 44. Wells 40 are dimensioned to accommodate block 18. The increased spacing between blocks 18 due to thickness of side wall 42 is compensated by overhang 44.

Figure 6:
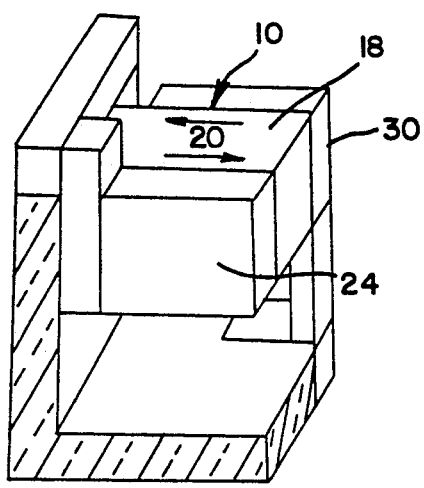
FIG. 6 is a perspective view of a single modulating element illustrating a degree of freedom available in determining the orientation of the reflective electrode.

Further flexibility exists in how elements 10 may be configured. FIG. 6 shows how element 10 may be rotated about its polarization direction 20 to establish a new orientation for electrode 24. FIG. 6 illustrates a 90 degree rotation; however, any angular value is permissible. Surface normals of electrode 24 and electrode 30 are perpendicular to polarization direction 20. After a 90 degree rotation, top surface 26 and bottom surface 38 of FIG. 2, could now be described as a front surface and a back surface. Block 18 contains two sets of parallel planar surfaces that may be used to interface electrode 24 and electrode 30.

Figure 7:
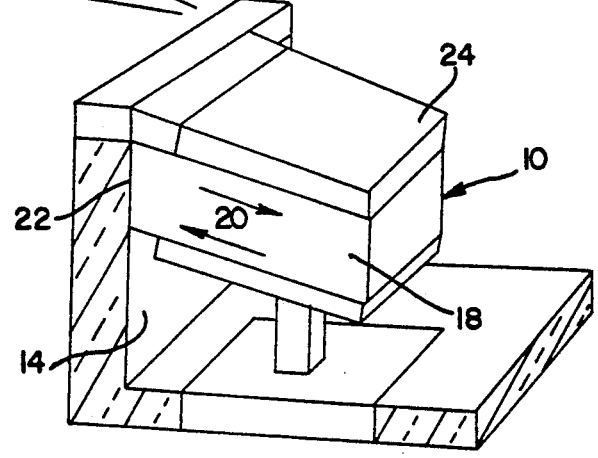
FIG. 7 is a perspective view of a single modulating element in an unenergized state, having an initial angular offset.

FIG. 7 shows element 10 in an unenergized state having an initial tilt orientation of $\theta$. Such an orientation may be achieved in an unenergized state by cleaving surface 22. Surface 22 intercepts polarization direction 20. A surface normal to ridge 14 will form an acute angle with direction 20. Block 18 may be rotated about direction 20 to further extend the latitude available in determining the orientation of electrode 24. These configuration options can be used to influence the stress distribution in element 10, which will influence the phase modulation capabilities of electrode 24.

Figure 8:
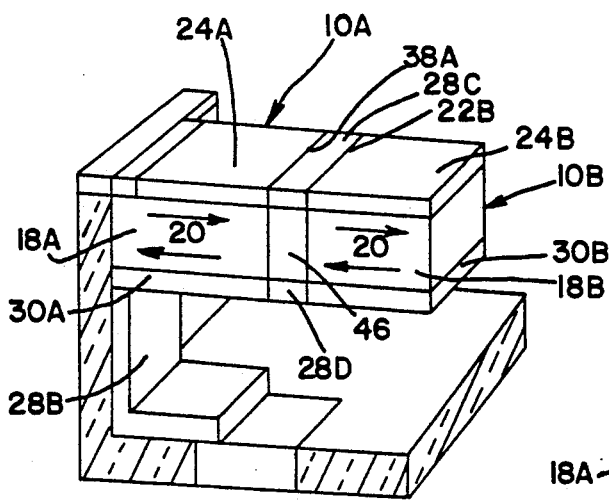
FIG. 8 illustrates how modulating elements may be coupled. The device is in an unenergized state.

FIG. 8 shows how a second element 10B may be coupled to a first element 10A. Left end surface 22B is affixed to right end surface 38A. An electrically insulating rigid spacer 46 may be used to isolate electrodes 30A and 24A from electrodes 30B and 24B, respectively. In FIG. 8, electrodes 30A and 30B are shown having a common potential due to flexible conductor 28D. Any of the previously discussed degrees of freedom may be employed in this configuration. The polarization directions for elements 10A and 10B may be selected independently and could be anti-parallel. Piezoelectric materials used for blocks 18A and 18B could be different. A flexible electrical conductor 28C maintains electrodes 24A and 24B at a common potential. This configuration maximizes the percentage of the spatial period attributed to a reflective electrode while confining electrode exposure area to one electrode. The form of 28B is changed from previous illustrations, but its function remains the same.

Figure 9:
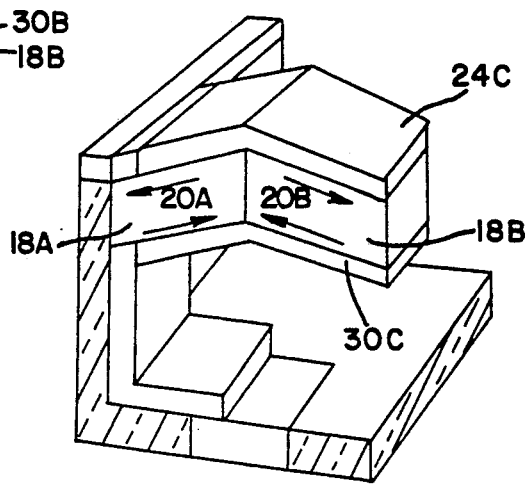
FIG. 9 illustrates coupled modulators in an energized state and is referred to as the Draw Bridge Modulator.

FIG. 9 illustrates an energized state of two coupled elements. This configuration will be referred to as the Draw Bridge Modulator. A single electrode 24C and a single electrode 30C are used in this configuration. If polarization directions 20A and 20B are anti-parallel when in an unenergized state, then a large rate of change will occur in electrode 24 when the Draw Bridge Modulator is energized.

The anti-parallel directions 20A and 20B could be generated by a suitable heat treatment of Lithium Niobate as described in the article "Hysteresis-Free Piezoelectric Actuators Using $LiNbO_3$ Plates with a Ferroelectric Inversion Layer" by K. Nakamura and M. Smimizu, Ferroelectrics, 1989, Vol. 93, pp. 211-216.

The preferred embodiment of my invention is the configuration of FIG. 9, blocks 18A and 18B having anti-parallel polarization directions when in an unenergized state, formed from a ferroelectric inversion layer, using the support structure 12 described in FIG. 4, with electrode 24 having overhang 44.

Theory of Operation

Referring to FIG. 2, a voltage is applied across buss bar 16 and electrode 34. This will establish an electric field in block 18. The electric field is parallel to the surface normals of electrode 24 and electrode 30. The direction or sense of the electric field is determined by the polarity of the applied voltage. This electric field is perpendicular to the polarization direction 20 of block 18. Piezoelectric block 18 is mounted in a cantilever fashion by having surface 22 affixed to rigid 14. Flexible conductors 28A and 28B impose no motion constraint on element 10. This configuration results in a piezoelectric boundary value problem. References for addressing simulation of these issues include the article "Simulation of Elastic Stresses and Polarization in Piezoelectric Ceramic by the Finite Difference Method" by W. B. Carlson and M. Kahn, Ferroelectrics, 1989, Vol. 99, pp. 165-172. Upon application of the voltage to electrodes 34 and buss bar 16, the element 10 and consequently electrode 24 will undergo a deflection. Referring to FIG. 3, the variable $\theta$ may be used to characterize the deflection curve of electrode 24.

The characteristic profile of the deflection curve for electrode 24 is a function of the magnitude of the applied voltage. Changing the magnitude of the applied voltage will change the characteristic profile. Reversing the polarity of the applied voltage will also effect the characteristic profile. Reversing the polarization direction 20, will, upon application of the applied voltage, effect the characteristic profile of electrode 24.

Referring to FIG. 1, if an electromagnetic and/or acoustical wavefront is incident upon the reflective electrode 24, a phase modulation dependent upon the characteristic profile of electrode 24 will be imparted to the wavefront. In this fashion, the applied voltage controls the phase modulation. A consideration when using a plurality of elements in an array is to avoid mechanical interference between the elements. This is straight forward for the degree of freedom identified in FIG. 1.

FIG. 7 shows how stress at a boundary may be effected. This is an important consideration when attempting to optimize a characteristic profile for a particular modulation application. Operation of this configuration is similar to that previously described.

In FIGS. 5-6, 8-9, additional factors already described are included to further influence the characteristic profile generated when a voltage is applied across electrode 34 and buss bar 16. Operation is similar to that previously described.

Summary, Ramifications and Scope

Thus the reader can see that the phase modulator of this invention does not require operational compromises in spatial resolution and/or electrical controllability to be fully implemented. Functionality of components is increased by having them serve dual roles as in the case of a reflective electrode or the support structure providing electrical isolation between adjacent electrodes of an array.

Furthermore, the mounting technique provides a means to influence the characteristic profile of the reflective electrode to assist in determining the phase modulation characteristics for a particular application. The mounting technique allows elements to be coupled to generate large rates of change in the characteristic profile of reflective electrodes.

While my above description contains many specificities, these should not be construed as limitations on the scope of the invention, but rather as an exemplification of one preferred embodiment there of. Many other variations are possible. The interface surface between a ridge and a piezoelectric block may be non-planer to further influence the stress distribution in the piezoelectric element, lending more degree of freedom to influence the characteristic profile of the reflective electrode. Poling techniques could influence what angle the polarization directions make with the normal to a ridge.

Accordingly, the scope of the invention should be determined not by the embodiments illustrated, but by the appended claims and the legal equivalents.

I claim:

1. A constrained shear mode modulator for use in phase modulating an electromagnetic wavefront comprising:
   a substrate,
   a piezoelectric element, said element is piezoelectrically polarized along a first axis,
   an optically reflective surface affixed to said element by a suitable means,
   a suitable electric field means for applying an electric field to said element along a second axis perpendicular to said first axis,
   said element further includes a first intercept surface, said first intercept surface intersects said first axis, said first intercept surface has a first intercept surface normal, said normal forms an acute angle with said first axis,
   a suitable intercept affixing means to affix said first intercept surface to said substrate,
   whereby varying the magnitude of said electric field means varies the orientation of said optically reflective surface which alters the phase of the electromagnetic wavefront incident on said optically reflective surface.

2. The device of claim 1 wherein said electric field means further includes a first electrode and a second electrode, said first electrode is affixed to said element by a suitable electrode affixing means, said second electrode is affixed to said element by a suitable electrode affixing means.

3. The device of claim 2, wherein said element further includes a first planar face and a second planar face, said first electrode is affixed to said first planar face by a suitable electrode affixing means, said second electrode is affixed to said second planar face by a suitable electrode affixing means.

4. The device of claim 3 wherein said first planar face is perpendicular to said second axis when said element is unenergized, said second planar face is parallel to said first planar face when said element is unenergized.

5. The device of claim 4 wherein said substrate further includes a ridge,
   said first intercept surface is affixed to said ridge by a suitable affixing means,
   said suitable electric field means further includes a perforation in said substrate, a stationary electrode embedded by a suitable means in said perforation, a suitable means to electrically connect said second electrode to said stationary electrode, a suitable potential control means to apply a potential difference between said first electrode and said stationary electrode.

6. The device of claim 5 wherein said first electrode is optically reflective.

7. The device of claim 2 wherein said first electrode is optically reflective.

8. The device of claim 1 wherein said element further includes, a second intercept surface, said second intercept surface intersects said first axis, said second intercept surface has a second intercept surface normal, said normal of said second intercept surface, forms an acute angle with said first axis, a second piezoelectric element, said second element is piezoelectrically polarized along a first axis, said second element further includes a first intercept surface, said first intercept surface of said second element intersects said first axis of said second element, said first intercept surface of said second element has a first intercept surface normal, said normal of said first intercept surface of said second element forms an acute angle with said first axis of said second element, said first intercept surface of said second element is affixed to said element by a suitable intercept affixing means, said suitable electric field means further includes applying to said second element an electric field along a second axial of said second element perpendicular to said first axis of said second element, a second optically reflective surface affixed to said second element by a suitable means.

9. The device of claim 8 wherein said suitable electric field means further includes, a first electrode affixed to said element by a suitable means, a second electrode affixed to said element by a suitable means, a third electrode affixed to said second element by a suitable means, a fourth electrode affixed to said second element by a suitable means.

10. A linear column array of constrained shear mode modulators for use in phase modulating an electromagnetic and/or acoustic wavefront comprising, a substrate, a plurality of essentially similar piezoelectric elements, each of said elements is piezoelectrically polarized along a first axis, each of said elements further includes a first intercept surface, said first intercept surface of each of said elements intersects said first axis of said element, each of said first intercept surfaces has a first intercept surface normal, said normal of said first intercept surface of each of said elements forms an acute angle with said first axis of said element, every said first intercept surface is affixed in a similar manner, by a suitable intercept affixing means, to said substrate, adjacent said elements are displaced by a first period, a suitable electric field means for applying to each of said elements a respective electric field along a second axis of said element perpendicular to said first axis of said element, said first period is perpendicular to every said first axis, said second axis of every said element are parallel when every said element is unenergized, a plurality of essentially similar optically reflective surfaces, each of said optically reflective surfaces is affixed in a similar manner, by a suitable means to a respective element, every said optically reflective surface is coplanar when every said element is unenergized, said first period is coplanar with every said optically reflective surface when every said element is unenergized, whereby varying each of said respective electric fields varies the orientation of a respective optically reflective surface thereby altering the phase of an electromagnetic and/or acoustic wavefront incident thereon in an effective, efficient manner.

11. The device of claim 10 wherein said suitable electric field means further includes, a plurality of first electrodes, each said first electrode is affixed by a suitable means to a respective element, a plurality of second electrodes, each said second electrode is affixed by a suitable means to a respective element.

12. The device of claim 11 wherein said suitable electric field means further includes electrically connecting every said first electrode by a suitable column buss means, a suitable potential control means for applying between said column buss means and each of said second electrodes a respective potential difference.

13. The device of claim 12 wherein said substrate further includes a ridge, every said first intercept surface is affixed in a similar manner, by a suitable intercept affixing means, to said ridge, said suitable electric field means further includes a plurality of perforations in said substrate, adjacent said perforations are displaced by said first period, a plurality of stationary electrodes, each of said stationary electrode is embedded in a respective perforation by a suitable means, each of said second electrodes is electrically connected to a respective stationary electrode by a suitable means, said suitable potential control means further includes applying said respective potential difference between said column buss means and said respective stationary electrode, said column buss means is affixed to said ridge by a suitable means, a suitable electrical isolation means to electrically isolate each of said second electrodes.

14. The device of claim 13 wherein said suitable means to electrically isolated each of said second electrodes further includes, a plurality of wells sunk in said substrate, adjacent said wells are displaced by said first period, adjacent said wells are separated by a common side wall, each of said perforations is located in a bottom surface of a respective well, each of said second electrodes is recessed in a respective well by a suitable means concealing each said second electrode, thereby providing electrical isolation.

15. The device of claim 14 wherein said first period is perpendicular to every said second axis, every said first electrode is optically reflective.

16. The device of claim 15 wherein each of said first electrodes is perpendicular to said second axis of said respective element when said respective element is unenergized,
   each of said first electrodes further includes an overhang, said overhang spanning approximately one half of said side wall between adjacent said wells.

17. The device of claim 13, further including a plurality of linear column arrays, adjacent ridges are displaced by a second period, said second period is perpendicular to said first period.

18. The device of claim 17 wherein said suitable electrical isolation means further includes,
   a plurality of wells sunk in said substrate, said wells are arranged into a matrix of p rows and q columns, adjacent said wells in each row are displaced by said second period, adjacent said wells in each column are displaced by said first period, adjacent said wells in each column are separated by a common side wall,
   each of said perforations are located in a bottom surface of a respective well,
   each said second electrode is recessed in a respective well by a suitable means, concealing each said second electrode, thereby enhancing electrical isolation.

19. The device of claim 18 wherein said first period is perpendicular to every said second axis, every first electrode is optically reflective.

20. The device of claim 19 wherein each of said first electrodes is
   perpendicular to said second axis of said respective element when said respective element is unenergized,
   every said column buss means is electrically connected to a common potential source by a suitable means,
   each said first electrode further includes an overhang, said overhang spanning approximately one half of said side wall.

21. The device of claim 10 wherein each of said elements further includes
   a second intercept surface, said second intercept surface of each of said elements intercepts said first axis of said element,
   each of said second intercept surfaces has a second intercept surface normal, said second intercept surface normal of said second intercept surface of each of said elements forms an acute angle with said first axis of said element,
   a plurality of essentially similar second piezoelectric elements, each of said second elements is piezoelectrically polarized along a first axis,
   each of said second elements further includes a first intercept surface, said first intercept surface of each of said second elements intersects said first axis of said second element,
   said first intercept surface of each of said second elements has a first intercept surface normal, said first intercept surface normal of said first intercept surface of each of said second elements forms an acute angle with said first axis of said second element,
   said first intercept surface of each of said second elements is affixed, in a similar manner, by a suitable intercept affixing means, to a respective elements,
   said suitable electric field means further includes applying to each of said second elements a respective electric field along a second axis of said second element perpendicular to said first axis of said second element,
   a plurality of essentially similar second optically reflective surfaces, each of said second optically reflective surface is affixed in a similar manner, by a suitable means to a respective second element,
   said first axis of each of said second elements is coplanar with said first axis of said respective element,
   said second axis of each of said second elements is parallel to said second axis of said respective element when each of said second elements and said respective element are unenergized.

22. The device of claim 21 wherein each of said second optically reflective surfaces is coplanar with said optically reflective surface of said respective element when each of said second elements and said respective element are unenergized,
   each of said second elements is essentially similar to said respective element,
   said suitable electric field means further includes a plurality of first electrodes, each said first electrode is affixed by a suitable means to a respective element, a plurality of second electrodes, each said second electrode is affixed by a suitable means to a respective element.

23. The device of claim 22 wherein said suitable electric field means further includes:
   electrically connecting every said first electrode by a suitable column buss means, a suitable potential control means for applying between said column buss means and each of said second electrodes a respective potential difference,
   said substrate further includes a ridge, said first intercept surface of every said element is affixed, in a similar manner, by a suitable intercept affixing means, to said ridge,
   said suitable electric field means further includes a plurality of perforations in said substrate, adjacent said perforations are displaced by said first period, a plurality of stationary electrodes, each said stationary electrode is embedded by a suitable means in a respective perforation, each of said second electrodes is electrically connected by a suitable means to a respective stationary electrode, said suitable potential control means further includes applying said respective potential difference between said column buss means and said respective stationary electrode,
   said suitable electric field means further includes a plurality of third electrodes, and a plurality of fourth electrodes, each of said third electrodes is affixed by a suitable means to a respective second element, each of said fourth electrodes is affixed by a suitable means to a respective second element,
   a suitable electrical isolation means to electrically isolate each of said first electrodes, and each of said second electrodes, and each of said third electrodes, and each of said fourth electrodes.

24. The device of claim 23, further including a plurality of linear column arrays, adjacent ridges are displaced by a second period, said second period is perpendicular to said first period.

25. The device of claim 24 wherein each of said third electrode is electrically connected by a suitable means to said second electrode of said respective element, said suitable electrical isolation means further includes a plurality of wells sunk in said substrate, said wells are arranged into a matrix of p rows and q columns, adjacent said wells in each row are displaced by said second period, adjacent said wells in each column are displaced by said first period, adjacent said wells in each column are separated by a column side wall, each perforation is located in a bottom surface of a respective well, each said third electrode and said second electrode of said respective element are recessed in a respective well by a suitable means, concealing each third electrode and each second electrode, thereby enhancing electrical isolation.

26. The device of claim 25 wherein said first period is perpendicular to said second axis of every said element, every said first electrode is optically reflective, every said fourth electrode is optically reflective.

27. The device of claim 26 wherein each of said first electrodes is perpendicular to said second axis of said respective element when said respective element is unenergized, each of said fourth electrodes is electrically connected by a suitable means to said first electrode of said respective element, every said first electrode and every said fourth electrode further includes an overhang, said overhang spanning approximate one half of said side wall.

28. The device of claim 27 wherein each said column buss means is electrically connected to a common potential source by a suitable means.

29. The device of claim 23 wherein each of said third electrodes is electrically connected by a suitable means to said second electrode of said respective element, said suitable electrical isolation means further includes a plurality of wells sunk in said substrate, adjacent said wells are displaced by said first period, adjacent said wells are separated by a common side wall, each perforation is located in a bottom surface of a respective well, each said third electrode and said second electrode of said respective element are recessed in a respective well by a suitable means, concealing each said third electrode and said second electrode of said respective element, thereby providing electrical isolation.

30. The device of claim 29 wherein said first period is perpendicular to said second axis of every said element, every said first electrode is optically reflective, every said fourth electrode is optically reflective, said suitable electrical isolation means further includes electrically connecting each of said fourth electrodes by a suitable means to said first electrode of said respective element.

31. The device of claim 30 wherein each of said first electrodes is perpendicular to said second axis of said respective element when said respective element is unenergized, said first axis of each of said second elements is collinear with said first axis of said respective element when each of said second elements and said respective element are unenergized, said first axis of each of said second elements is antiparallel to said first axis of said respective element when said second element and said respective element are unenergized, every said first electrode and every said fourth electrode further includes an overhang, said overhang spanning approximately one half of said side wall.

32. A constrained shear mode modulator for use in phase modulating and electromagnetic and/or acoustic wavefronts comprising, a substrate, said substrate further includes a plurality of ridges, a plurality of essentially similar piezoelectric elements arranged in a matrix of p rows and q columns, each of said elements is piezoelectrically polarized along a first axis, each element further includes a first intercept surface, said first intercept surface of each of said elements intersects said first axis of said element, each of said first intercept surfaces has a first intercept surface normal, said normal of said first intercept surface of each of said elements forms an acute angle with said first axis of said element, said first intercept surface of every said element in each column q is affixed, in a similar manner, by a suitable intercept affixing means, to a respective ridge, adjacent said elements in each column q are displaced by a first period, adjacent said ridges are displaced by a second period, said second period is perpendicular to said first period, a suitable electric field means to apply to each of said elements a respective electric field along a second axis of said element perpendicular to said first axis of said element, said second axis of every said element are parallel when every said element is unenergized, a plurality of essentially similar optically reflective surfaces, each of said optically reflective surfaces is affixed in a similar manner to a respective element by a suitable means, every said optically reflective surface is coplanar when every said element is unenergized, said first period is coplanar with every said optically reflective surface when every said element is unenergized, said first period is perpendicular to every said first axis, whereby varying said suitable potential control means varies the orientation of a respective optically reflective surface thereby phase modulating a wavefront incident thereon in an effective, efficient manner.

33. The device of claim 32 wherein said electric field means further includes a plurality of first electrodes and a plurality of second electrodes, each of said first electrodes is affixed by a suitable means to a respective element, each of said second electrodes is affixed by a suitable means to a respective element, said electric field means further includes a plurality of perforations in said substrate, said perforations are arranged in a matrix of p rows and q columns, adjacent said perforations in each row p are displaced by said second period, adjacent said perforations in each column q are displaced by said first period, said electric field means further includes a plurality of stationary electrodes, each of said stationary electrodes is embedded by a suitable means in a respective perforation, each of said second electrodes is electrically connected by a suitable means to a respective stationary electrode, said suitable electric field means further includes a suitable potential control means to apply between each said first electrode and said respective stationary electrode a respective potential difference, a suitable electrical isolation means to electrically isolate each of said second electrodes.

34. The device of claim 33 wherein said suitable electric field means further includes electrically connecting every first electrode in a respective column by a respective column buss means, each column buss means is affixed to a respective ridge by a suitable means, said suitable potential control means further includes applying said respective potential difference between each column buss means and said respective stationary electrode in said respective column.

* * * * *